United States Patent [19]

Lunardi et al.

[11] Patent Number: 5,106,766
[45] Date of Patent: Apr. 21, 1992

[54] METHOD OF MAKING A SEMICONDUCTOR DEVICE THAT COMPRISES P-TYPE III-V SEMICONDUCTOR MATERIAL

[75] Inventors: Leda M. Lunardi, New Providence; Roger J. Malik, Warren; Robert W. Ryan, Piscataway, all of N.J.

[73] Assignee: AT&T Bell Laboratories, Murray Hill, N.J.

[21] Appl. No.: 606,003

[22] Filed: Oct. 30, 1990

Related U.S. Application Data

[62] Division of Ser. No. 378,534, Jul. 11, 1989, Pat. No. 5,001,534.

[51] Int. Cl.[5] ............... H01L 21/265; H01L 29/73
[52] U.S. Cl. ............................... 437/31; 357/34; 148/DIG. 11; 148/DIG. 72
[58] Field of Search ................. 437/31; 148/DIG. 40

[56] References Cited

U.S. PATENT DOCUMENTS

| | | | |
|---|---|---|---|
| 3,881,113 | 4/1975 | Rideout et al. | 437/51 |
| 4,179,308 | 12/1979 | Olsen et al. | 357/30 |
| 4,632,710 | 12/1986 | Van Rees | 148/DIG. 40 |
| 4,794,440 | 12/1988 | Capasso et al. | 357/34 |
| 4,825,265 | 4/1989 | Lunardi et al. | 357/16 |
| 4,829,343 | 5/1989 | Levi | 357/16 |
| 4,904,616 | 2/1990 | Bohling et al. | 148/DIG. 65 |
| 4,920,067 | 4/1990 | Knapp | 437/119 |
| 4,939,102 | 7/1990 | Hamm et al. | 437/31 |

OTHER PUBLICATIONS

"Dramatic enhancement in the gain of a GaAs/AlGaAs Heterostructure Bipolar Transistor by Surface Chemical Passivation," C. J. Sandroff et al., *Applied Physics Letters*, vol. 51(1), pp. 33-35, 1987.

"Super-gain AlGaAs/GaAs Heterojunction Bipolar Transistors Using an Emitter Edge-thinning Design," Hao-Hsiung Lin and Si-Chen Lee, *Applied Physics Letters*, vol. 47(8), pp. 839-841, 1985.

"Transport and Related Properties of (Ga,Al)As/GaAs Double Heterostructure Bipolar Junction Transistors," S. Tiwari et al., *IEEE Transactions on Electron Devices*, vol. ED-34, No. 2, Feb. 1987, pp. 185-197.

"Effect of Emitter-Base Spacing on the Current Gain of AlGaAs/GaAs Heterojunction Bipolar Transistors," W-S. Lee et al., *IEEE Electron Device Letters*, vol. 10, No. 5, May 1989, pp. 200-202.

"An Isothermal Etchback-regrowth Method for High-efficiency $Ga_{1-x}Al_xAs$-GaAs Solar Cells", by J. M. Woodall et al., *Applied Physics Letters*, vol. 30, No. 9, May 1, 1977, pp. 492-493.

"GaAs Concentrator Solar Cell", by L. W. James, *Applied Physics Letters*, vol. 26, No. 8, Apr. 15, 1975, pp. 467-470.

*Primary Examiner*—Robert Kunemund
*Assistant Examiner*—Long Pham
*Attorney, Agent, or Firm*—E. E. Pacher

[57] ABSTRACT

A novel method of making a semiconductor device that comprises p-type III-V semiconductor material is disclosed. The method comprises heating of a graphite body such that the body serves as a sublimation source of carbon atoms that are incorporated into the III-V semiconductor material. Exemplarily, the carbon doped material is the base of a GaAs-based HBT.

6 Claims, 4 Drawing Sheets

METHOD OF MAKING A SEMICONDUCTOR DEVICE THAT COMPRISES P-TYPE III-V SEMICONDUCTOR MATERIAL

This is a division of application Ser. No. 07/378,534 filed Jul. 11, 1989, now U.S. Pat. No. 5,001,534.

FIELD OF THE INVENTION

This invention pertains to heterojunction bipolar transistors, to articles comprising such a transistor or transistors, and to methods for producing such transistors.

BACKGROUND OF THE INVENTION

It has been known for some time that at least some heterojunction bipolar transistors (HBTs) have the potential for very high speed, and much effort has been expended on the development of HBTs. See, for instance, U.S. Pat. No. 4,794,440, which discloses HBTs that comprise means for changing the carrier transport properties in at least one of the three regions (emitter, base, collector) of the transistors. See also U.S. Pat. No. 4,829,343 and U.S. patent applications Ser. No. 241,279 and 250,790, all dealing with hot electron HBTs.

In order for HBTs to find wide use, and especially to be incorporated into large scale integrated circuits, it is important to be able to scale down lateral device dimensions so as to minimize total current (power) associated with device operation. The emitter stripe width conventionally is used to indicate the lateral device size.

The material system that has so far probably received the most attention for HBT use is the AlGaAs/GaAs system. Despite substantial efforts however it has not yet been possible to develop a reliable manufacturing process for producing AlGaAs/GaAs HBTs that have both small emitter strip width and high current gain. Due to the inability to manufacture HBTs with small lateral dimensions (e.g., emitter stripe width of 1 $\mu$m or less), the scale of integration of AlGaAs/GaAs HBTs lags substantially behind that attained in silicon bipolar technology.

One of the main reasons for the above referred-to difficulty in manufacturing AlGaAs/GaAs HBTs that have both high current gain and small lateral dimensions is the high value of the surface recombination velocity of GaAs. In the GaAs extrinsic base region of HBTs with small emitter stripe width, the surface recombination current typically dominates the total base current, decreasing the current gain of the transistor. Similar effects are likely to occur in HBTs using other compound semiconductor systems.

Different approaches for overcoming the above referred-to problem have been reported. However, these have not proven to be fully satisfactory. For instance, C. J. Sandroff et al., *Applied Physics Letters*, Vol. 51(1), pp. 33-35, report passivation of the extrinsic base region by spin coating thin films of $Na_2S \cdot 9H_2O$ onto the devices after their fabrication. However, such sulfide films are hygroscopic, and the attainable gain enhancement typically is only temporary. A different approach was taken by H. H. Lin et al., *Applied Physics Letters*, Vol. 47(8), pp. 839-841. These workers report thinning a portion of a relatively thick emitter layer by etching, with the thinned portion forming a passivation layer on the GaAs base. The etching is a critical step that required monitoring by means of an interferometer, making the process at best difficult to carry out in a manufacturing environment. Thus, GaAs-based HBTs with an etched base passivation layer are not likely to be manufacturable with acceptable yield.

GaAs-based HBTs comprising base passivation layers have also been disclosed by S. Tiwari, *IEEE Transactions on Electron Devices*, Vol. ED-34(2), pp. 185-197, and W. S. Lee et al., *IEEE Electron Device Letters*, Vol. 10(5), pp. 200-202. The latter reference discloses for instance a GaAs-based HBT that comprises a depleted AlGaAs emitter layer that serves to passivate a portion of the GaAs base, with the base contact placed onto the portion of the base surface not covered by the AlGaAs emitter layer. Such a structure too is relatively difficult to manufacture, requiring closely controlled etching and deposition steps, and still leaves a significant portion of the GaAs base surface unpassivated.

In view of the great economic significance of HBTs, and of achieving scalability in GaAs-based and other HBTs, a device that can have high current gain with very small emitter stripe width, and which can be readily manufactured, would be of great interest. This application discloses such a device, and a process for making it.

GLOSSARY AND DEFINITIONS

A "heterojunction bipolar" transistor is a three-terminal device comprising three regions of alternating conductivity type which are commonly referred to as emitter, base, and collector regions, with at least two contiguous regions (exemplarily the emitter and base regions) differing in their composition, (other than their difference in doping).

The emitter "stripe width" is the smallest lateral dimension of the electrically active portion of the emitter structure.

The "extrinsic" base region is that portion of the base that is not underlying the emitter stripe. It is to be noted that in this context "extrinsic" does not refer to semiconductor material whose carrier concentration has been changed by doping but instead describes a purely geometrical condition.

"Scaling" refers herein to the fact that, ideally, an appropriate combination of changes in lateral and vertical dimensions of a bipolar transistor can result in a smaller device having, significantly, the same current gain as the corresponding larger device.

The "bandgap" of a single crystal semiconductor material is the minimum energy difference between the conduction band and the valence band of the material.

SUMMARY OF THE INVENTION

In a broad aspect, the instant invention is a HBT structure that overcomes problems associated with prior art HBTs, e.g., lack of scalability, and that is more readily manufacturable than prior art HBTs. It is also a method of making HBTs that is more readily implemented in a manufacturing environment than are prior art methods. Significant features of HBTs according to the invention are the presence of a thin emitter layer that essentially completely covers the major surface of the base and passivates the extrinsic base region, and base contacts located on the thin emitter layer.

An inventive HBT comprises a semiconductor body that comprises an emitter region, a collector region, and a base region between the emitter and the collector regions, and further comprises means for making electrical contact with the emitter, base and collector regions, respectively. The emitter region comprises first semiconductor material that has a larger bandgap than the base region material and that is of opposite conductivity type from the base region material. Associated with the emitter region is an emitter stripe width W, and the base region comprises an "extrinsic" base region.

Furthermore, the emitter region comprises a layer of first semiconductor material that overlies essentially all of the base region (i.e., that is in contact with essentially all of the major surface of the base region), with the thickness of the layer chosen such that the portion of the layer that overlies the extrinsic base region is substantially fully depleted of conduction electrons at all bias voltages within the normal operating range of the transistor. Still furthermore, the means for making electrical contact to the base region comprise a region (exemplarily a metallized region) on the layer of first semiconductor material that provides an ohmic contact with the base region. HBTs according to the invention can be substantially scalable, thus permitting relatively high device density on IC chips.

The invention is also embodied in a method of producing an article that comprises a HBT. The HBT comprises a semiconductor body that in turn comprises an emitter region, a collector region, and a base region between the emitter and collector regions, and further comprises means for making electrical contact with the emitter, base and collector regions, respectively. The method comprises providing a semiconductor substrate with a multiplicity of semiconductor layers thereon. The multiplicity comprises, in sequence, a collector layer of a first conductivity type, a base layer of a second conductivity type, an emitter layer of the first conductivity type, and at least one further layer on the emitter layer, the material of the emitter layer chosen to have a larger bandgap than the material of the base layer. The method further comprises removing the at least one further layer in selected regions, thereby exposing selected portions of the emitter layer in the semiconductor body, and providing the means for making electrical contact with the emitter, base and collector regions.

Furthermore, the method comprises removing selected portions of the emitter layer and of the base layer, the removal carried out such that the emitter layer covers substantially all of the base layer in the semiconductor body. The method still further comprises providing the means for making electrical contact to the base by a process that comprises causing the formation of an ohmic contact between a region on the emitter layer and the base layer, exemplarily by a process that comprises forming a metallized region on the emitter layer.

Although currently preferred embodiments of the invention are GaAs-based transistors, the invention is not so limited. Indeed, HBTs according to the invention can be embodied in any material system that permits epitaxial growth of a single crystal emitter layer on a single crystal base layer, with the material of the emitter layer differing in composition from that of the base layer in such a way that the emitter layer has a larger bandgap than the base layer. Exemplarily of such material systems are the following: AlGaAs/GaAs, AlGaAs/InGaAs, AlGaAs/AlGaAs, AlGaSb/GaSb, InP/InGaAs, InAlAs/InGaAs, GaAsP/GaAs, Si/SiGe, GaP/Si, GaAs/Ge, and CdTe/HgTe. It will be understood that in the above listed combinations of materials the first listed material is the emitter layer material and the second listed material is the base material. It will also be understood that above only the elemental constituents of the various material systems are listed, as is commonly practiced in the art. Exemplarily, AlGaAs is understood to refer to material of composition $Al_{1-x}Ga_xAs$, with $0 < x < 1$.

The method according to the invention comprises many steps that are conventional and well known to those skilled in the art and that therefore do not require detailed description. Exemplary of such steps are the preparation of substrate wafers; growth thereon of a multiplicity of single crystal semiconductor layers of various compositions, conductivity types and/or doping levels by any appropriate technique such as MBE, CVD, or MOCVD; deposition of metallization layers; photolithography; and patterning by means of etching, including wet etching or dry etching techniques such as RIE.

DETAILED DESCRIPTION OF SOME CURRENTLY PREFERRED EMBODIMENTS

Figure 1:
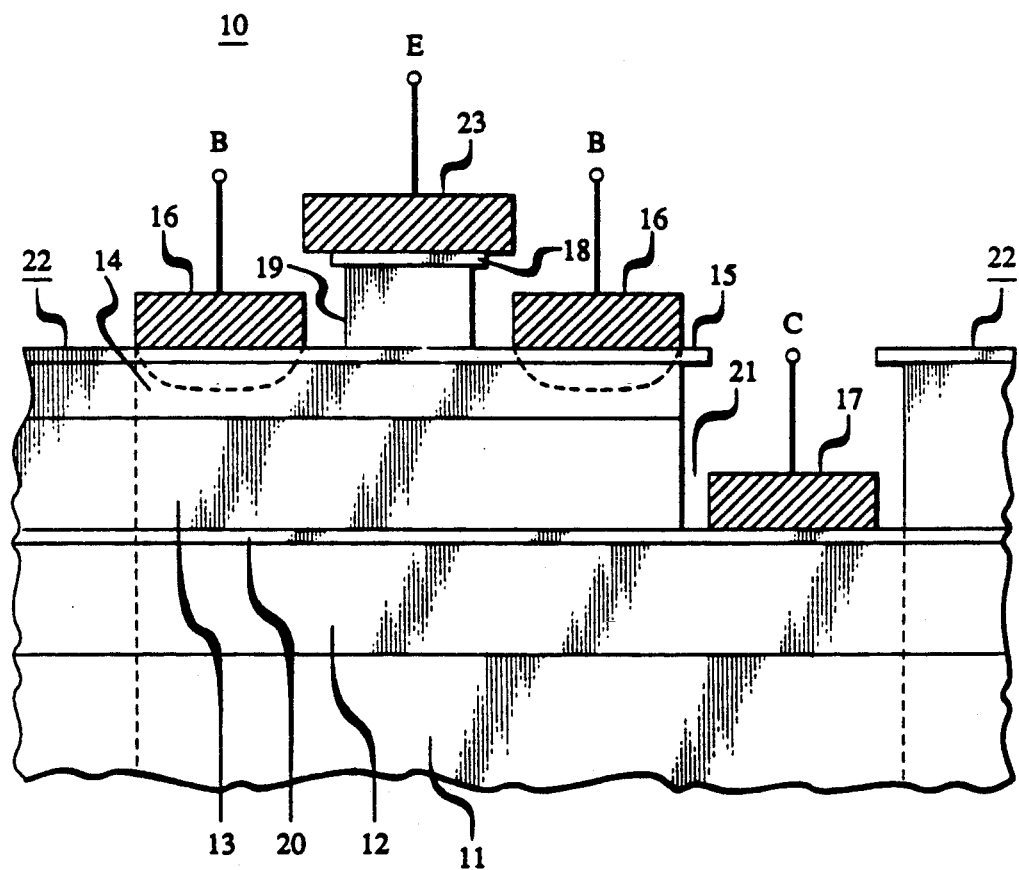
FIG. 1 schematically depicts an exemplary HBT according to the invention.

FIG. 1 schematically depicts in cross section an exemplary HBT 10 according to the invention. Exemplarily, transistor 10 is a gallium arsenide-based HBT formed on a semi-insulating (100) GaAs substrate 11. On the substrate, and epitaxial therewith, is subcollector 12, exemplarily a n+GaAs layer. On the subcollector layer are, in sequence, etch stop layer 20, collector 13, base 14, and emitter 15. All of these are epitaxial with the substrate, as will be readily appreciated by those skilled in the art. On emitter 15 is contact layer 19, with cap layer 18 situated thereon. Patterned metallization regions 23, 16 and 17 serve to provide electrical contact with the emitter, base, and collector, respectively, with the latter contact situated in via hole 21. Ion implanted regions 22 serve to electrically isolate transistor 10 from other devices formed on the same substrate. Such isolation, and means for accomplishing it, are well known to those skilled in the art.

Emitter layer 15 advantageously is very thin, exemplarily between about 5 and 25 nm. More generally, the lower limit of the acceptable thickness is such that under normal operating conditions the reverse tunneling current (i.e., tunneling of holes from the base into contact layer 19) is negligible. The upper level of acceptable thickness of the emitter layer is determined by the condition that the material of the emitter layer be substantially fully depleted of conduction electrons at all bias levels within the normal operating range of the transistor, exemplarily $V_{be}$ in the range 0.5-2.0 V.

Significantly, as can be seen from FIG. 1, the base contacts 16 are placed on emitter layer 15. Furthermore, the emitter layer 15 is of essentially the same thickness in the extrinsic base region as it is in the intrinsic base region, i.e., that portion that underlies the contact layer 19.

A HBT of the type exemplified by FIG. 1 has significant advantages over prior art devices. For instance, the emitter layer serves both as an etch stop layer and as a passivation layer. The structure can be produced in self-aligned fashion, thereby avoiding critical alignment steps. Due to the thinness of emitter layer 15 it is readily possible to establish ohmic contact to base layer 14 through the emitter. All of the above contribute to making the inventive HBT relatively easily and reliably manufacturable. Furthermore, since base contact is established through the emitter layer it is possible to reliably contact base layers of essentially any thickness, including a base comprising a submonolayer of dopant atoms, such as is disclosed in U.S. Pat. No. 4,825,265.

The details of the epitaxial layer structure of a particular exemplary HBT according to the invention are given in Table I, wherein the numerals in the first column refer to FIG. 1, and wherein the designations n and p refer to the conductivity type of the layer material in the usual way, and "i" stands for "Intrinsic".

TABLE 1

Epitaxial Layer Structure Of A GaAs-based Heterojunction Bipolar Transistor

| layer | Thickness (Å) | Type | Doping ($cm^{-3}$) | Alloy Composition |
|---|---|---|---|---|
| cap layer 18 | 300 | $In_yGa_{1-y}As$-n | $2 \times 10^{19}$ | $y = 0.5$ |
| cap layer 18 | 200 | $In_yGa_{1-y}As$-n | $2 \times 10^{19}$ | $y = 0 \rightarrow 0.5$ |
| contact layer 19 | 2000 | GaAs-n | $5 \times 10^{18}$ | |
| contact layer 19 | 100 | $Al_xGa_{1-x}As$-n | $5 \times 10^{17}$ | $x = 0.35 \rightarrow 0$ |
| emitter 15 | 150 | $Al_xGa_{1-x}As$-n | $5 \times 10^{17}$ | $x = 0.35$ |
| base 14 | 50 | $Al_xGa_{1-x}As$-i | | $x = 0.06$ |
| base 14 | 600 | $Al_xGa_{1-x}As$-p | $2.5 \times 10^{19}$ | $x = 0 \rightarrow 0.06$ |
| collector 13 | 3000 | GaAs-n | $1 \times 10^{17}$ | |
| collector 13 | 1000 | GaAs-n | $5 \times 10^{18}$ | |
| etch stop 20 | 100 | $Al_xGa_{1-x}As$-n | $5 \times 10^{18}$ | $x = 0.3 \rightarrow 0$ |
| etch stop 20 | 100 | $Al_xGa_{1-x}As$-n | $5 \times 10^{18}$ | $x = 0 \rightarrow 0.3$ |
| sub-collector 12 | 5000 | GaAs-n | $5 \times 10^{18}$ | |

As can be seen from Table 1, the base layer incorporates a linear grading of Al to create a quasi electric field to increase transport in this region. This is an optional feature. The doping and thickness of the emitter layer 15 of the exemplary HBT was designed such that the material of the emitter layer is fully depleted above the extrinsic base region because of the Fermi level pinning of the AlGaAs surface. Although the exemplary layer sequence of Table 1 corresponds to a HBT utilizing thermionic emission of electrons into the base, the invention is not so limited. In particular, the invention can be embodied in HBTs with tunnel emission, as will be appreciated by those skilled in the art.

Devices according to the invention can have a wide range of lateral dimensions. However, the invention is most advantageously practiced with devices having relatively small lateral dimensions, typically emitter stripe width of less than 5 μm, frequently less than 1 μm.

Figure 2:
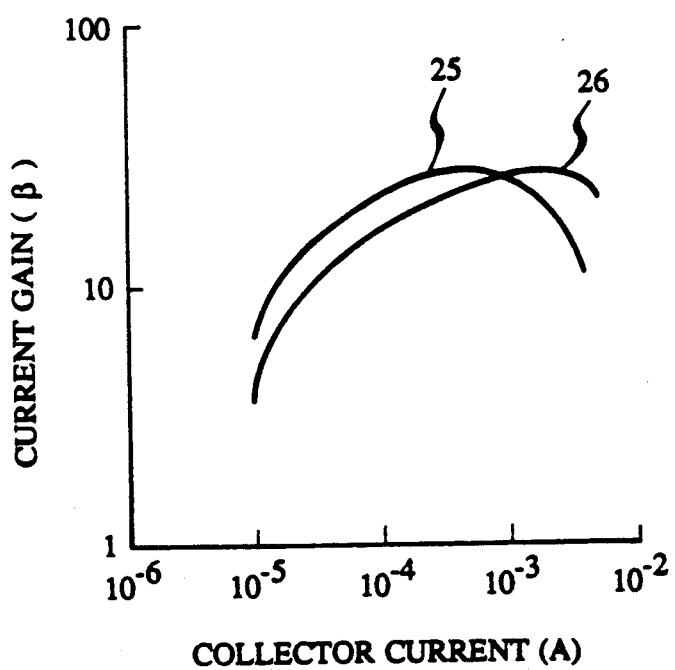
FIG. 2 shows exemplary data on current gain versus collector current for two HBTs according to the invention.

FIG. 2 shows the dependence of the current gain upon collector current for two HBTs according to the invention that differ in their emitter size, curve 25 pertaining to a device with $0.3 \times 4$ μm$^2$ emitter, and curve 26 to a device with $2.3 \times 10$ μm$^2$ emitter. The curves are substantially parallel and both transistors exhibit a peak current gain of about 25. Essentially, the current gain is the same for both transistors at the same collector current density, demonstrating the scalability of inventive HBTs, substantially without current gain degradation.

HBTs according to the invention are exemplarily produced as follows. On a (100) oriented semi-insulating gallium arsenide substrate are grown the desired layers, exemplarily the layers listed in Table 1, by MBE. The active device regions are defined by photoresist and the remaining areas are made semi-insulating by ion implantation using a sequence of doses and energies, as is well known to those skilled in the art. Next a thin tungsten layer is deposited over the entire wafer. Selected regions of the emitter layer are exposed by a process that comprises metal deposition and lift-off of Ti/Au/Ni and subsequent RIE of the exposed tungsten, using $SF_6$ as the etchant gas. The process further comprises wet chemical etching of the exposed regions of the InGaAs cap layer, and selective removal of the underlying GaAs by RIE with $CCl_2F_2$. The amount of undercut in the last step is controlled by adjusting the RIE conditions. Each of these steps individually is conventional and well understood by those skilled in the art. The base contacts are formed by evaporation and lift-of of AuBe directly over the emitter finger to form self-aligned emitter-base contacts. Next, AuGeNi/Au is evaporated and lifted-off for the collector contact. The base and collector contacts are formed simultaneously by heating the wafer to 420° C. for 10 seconds in a rapid thermal anneal furnace. This heat treatment causes diffusion of base metallization through the thin emitter layer such that a low resistance ohmic contact with the base layer is formed. Finally, contact pads are formed by evaporation of Ti/Au.

In some currently preferred embodiments the p-type dopant is C, since this element has a substantially smaller diffusion coefficient in GaAs (and other III-V semiconductors) than do such prior art dopants as Be. A particularly convenient technique for accomplishing the C-doping involves sublimation of C from a heated carbon filament in an MBE growth chamber. Exemplarily, the filament is machined from a graphite sheet, cut to yield a serpentine shape, with current contact pads on both ends of the filament. The filament is dimensioned to result in a convenient resistance value, exemplarily about 1 ohm. In order to achieve high dopant concentration, the filament typically is heated above about 2000° C.

Figure 3:
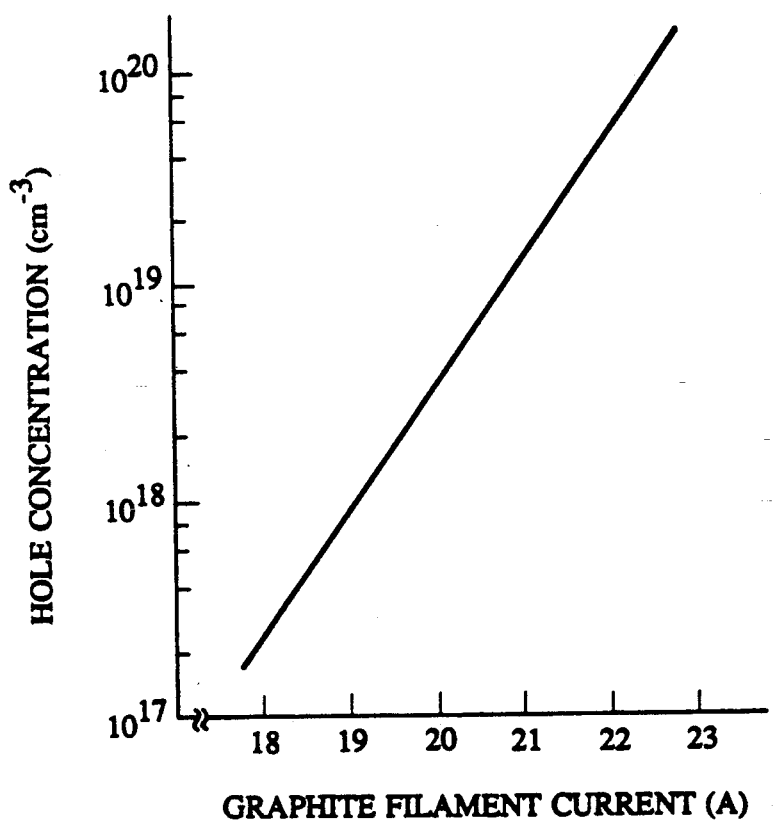
FIG. 3 gives exemplary data on hole concentration as a function of current through a graphite filament.
Figure 4:
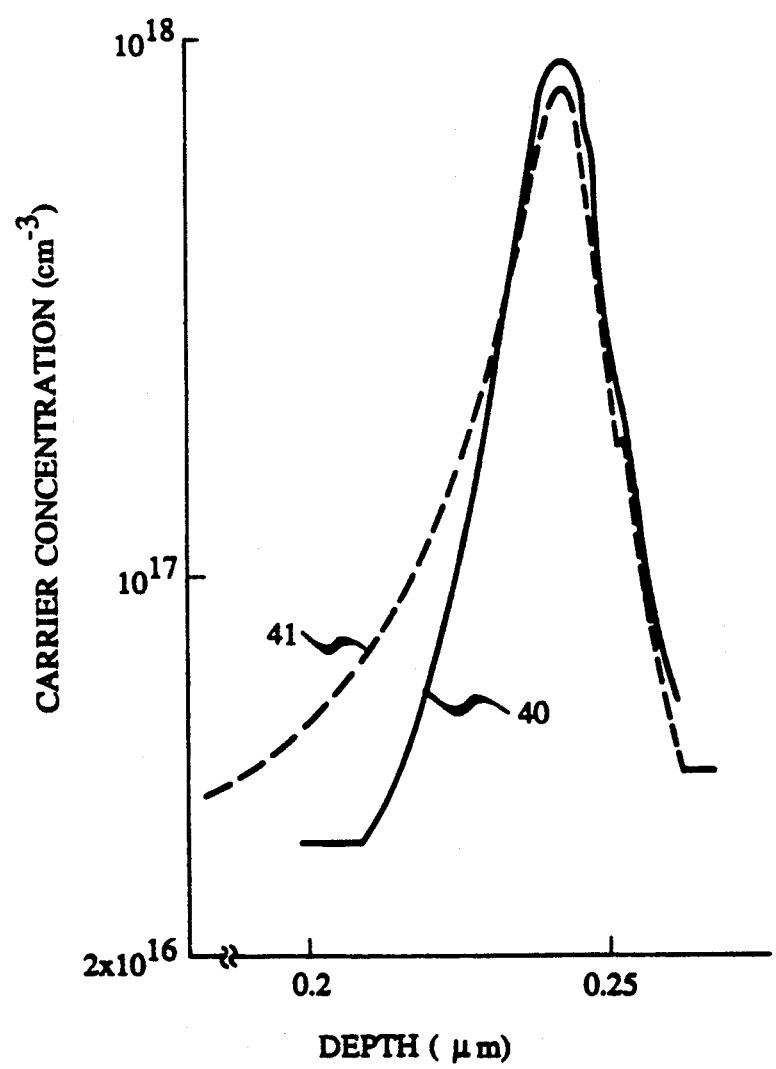
FIG. 4 shows exemplary data on hole concentration as a function of depth in carbon-doped GaAs.

FIG. 3 gives exemplary data on hole concentration in C-doped GaAs (grown at a rate of 1 μm/hr) as a function of graphite filament current. FIG. 4 shows exemplary data on the carrier concentration in C-doped GaAs as a function of distance from the layer surface, both as grown (curve 40) and after a rapid thermal anneal of 5 seconds at 800° C. (curve 41), and demonstrates the relative absence of diffusion of carbon.

The above discussed use of C-doping of III-V semiconductors makes possible a new processing technology that comprises Be implantation to contact the base, and HBTs comprising a C-doped base and implanted Be base contact means are contemplated.

I claim:

1. Method of making a semiconductor device that comprises p-type III-V semiconductor material,
    the method comprising growing the III-V semiconductor material by exposing a substrate to at least a first and a second molecular or atomic species, with the first and second species comprising a column III and a column V chemical element, respectively, characterized in that the method further comprises heating a graphite body such that the growing III–V semiconductor material is exposed to sublimated carbon atoms and carbon atoms are incorporated into the III–V semiconductor material.

2. The method of claim 1, wherein the semiconductor device is a n-p-n heterojunction bipolar transistor.

3. The method of claim 1, wherein the III–V semiconductor material comprises Ga and As.

4. The method of claim 1, wherein exposing the substrate to the first and second atomic or molecular species comprises exposing the substrate to a flux of the first and second atomic species in a growth chamber.

5. The method of claim 1, wherein the graphite body is heated to a temperature above 2000° C.

6. A method of producing an article comprising a heterojunction bipolar transistor comprising a semiconductor body comprising an emitter region, a collector region, and a base region between the emitter and collector regions, and further comprising means for making electrical contact with the emitter, base and collector regions, respectively; the method comprising
   a) providing a semiconductor substrate with a multiplicity of semiconductor layers thereon, the multiplicity comprising, in sequence, a collector layer of a first conductivity type, a base layer of a second conductivity type, an emitter layer of the first conductivity type, and at least one further layer on the emitter layer, the material of the emitter layer chosen to have a larger bandgap than the material of the base layer;
   b) removing the at least one further layer in selected regions, thereby exposing selected portions of the emitter layer in the semiconductor body; and
   c) providing the means for making electrical contact with the emitter, base and collector regions;
   characterized in that the method further comprises
   d) removing selected portions of the emitter layer and of the base layer such that the emitter layer covers substantially all of the base layer in the semiconductor body;
   e) step c) comprises causing the formation of an ohmic contact between a region on the emitter layer and the base region; and
   f) step a) comprises heating a carbon member such that a portion of the carbon sublimes, with some of the sublimated carbon being incorporated into at least one of the multiplicity of semiconductor layers.

* * * * *

UNITED STATES PATENT AND TRADEMARK OFFICE
CERTIFICATE OF CORRECTION

PATENT NO.   :   5,106,766
DATED        :   April 21, 1992
INVENTOR(S)  :   Roger John Malik It is certified that error appears in the above-identified patent and that said Letters Patent is hereby corrected as shown below:

On the title page: Item [75] Inventors:

Please delete the names of Leda Maria Lunardi and Robert William Ryan from the list of inventors. The sole inventor is Roger John Malik.

Signed and Sealed this

Thirteenth Day of July, 1993

Attest:

MICHAEL K. KIRK

*Attesting Officer*     Acting Commissioner of Patents and Trademarks